(12) United States Patent  
King et al.

(10) Patent No.: US 7,199,473 B2  
(45) Date of Patent: Apr. 3, 2007

(54) INTEGRATED LOW-K HARD MASK

(75) Inventors: Sean W. King, Hillsboro, OR (US); Andrew W. Ott, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 161 days.

(21) Appl. No.: 11/028,884

(22) Filed: Jan. 3, 2005

(65) Prior Publication Data

US 2006/0038296 A1  Feb. 23, 2006

Related U.S. Application Data

(62) Division of application No. 10/922,619, filed on Aug. 19, 2004.

(51) Int. Cl.
*H01L 23/48* (2006.01)
*H01L 23/52* (2006.01)
*H01L 29/40* (2006.01)

(52) U.S. Cl. .................. 257/758; 257/760; 257/774

(58) Field of Classification Search ........ 438/622–640, 438/687; 257/750–753, 758–760, 762, 774–776
See application file for complete search history.

(56) References Cited

U.S. PATENT DOCUMENTS

| | | | |
|---|---|---|---|
| 5,946,601 A | 8/1999 | Wong et al. | 438/783 |
| 6,261,726 B1 | 7/2001 | Brooks et al. | 430/5 |
| 6,291,887 B1 | 9/2001 | Wang et al. | 257/758 |
| 6,489,233 B2 | 12/2002 | Chooi et al. | 438/637 |
| 2001/0006848 A1 | 7/2001 | Allada et al. | 438/687 |
| 2002/0090806 A1 | 7/2002 | Ahn et al. | 438/618 |
| 2003/0075803 A1 | 4/2003 | Gates et al. | 257/759 |
| 2003/0113995 A1* | 6/2003 | Xia et al. | 438/638 |
| 2003/0134495 A1* | 7/2003 | Gates et al. | 438/600 |
| 2004/0021196 A1* | 2/2004 | Brennan et al. | 257/508 |
| 2004/0094839 A1 | 5/2004 | Fitzsimmons et al. | 257/758 |
| 2004/0119163 A1 | 6/2004 | Wong et al. | 257/758 |

FOREIGN PATENT DOCUMENTS

JP  2002 093747  3/2002

OTHER PUBLICATIONS

M. Aono et al., "Dielectric Properties of Amorphous Carbon Nitride Films", Mat. Res. Soc. Symp. Proc. vol. 593, 2000 Materials Research Society, pp. 493-498.
M. Aono, et al., "Amorphous Carbon Nitride Films As A Candidate For Low Dielectric Constant Materials", Mat. Res. Soc. Symp. Proc. vol. 565, 1999 Materials Research Society, pp. 291-296.
H. Ohtake et al., "Cu Dual Damascene Interconnects With In-Situ Fluorinated Carbon-Nitride (FCN:-C=N(F)-) Barrier Layers In Low-K Organic Film", 2002 IEEE, pp. 599-602.

* cited by examiner

Primary Examiner—Thanhha Pham
(74) Attorney, Agent, or Firm—Micheal D. Plimier

(57) ABSTRACT

Embodiments of the invention provide a device with a hard mask layer between first and second ILD layers. The hard mask layer may have a k value approximately equal to the first and/or second ILD layers.

14 Claims, 10 Drawing Sheets

INTEGRATED LOW-K HARD MASK

This is a Divisional application of Ser. No. 10/922,619 filed Aug. 19, 2004, which is presently pending.

BACKGROUND

Background of the Invention

In a microelectronic structure, such as a substrate, conductors, such as vias and traces, carry signals between layers of the substrate or other structure. The vias and traces by layers of dielectric materials. Low dielectric constant ("k value") materials are used in the layers of dielectric materials between the conductors to reduce resistance capacitance ("RC") delay and improve device performance. During fabrication of the substrate or other structure, a sacrificial high k value hard mask layer may be used to pattern trenches and holes. The high k value hard mask layer is then removed to keep the k value low.

BRIEF DESCRIPTION OF THE DRAWINGS

FIGS. 2a through 2l are cross sectional side views that illustrate how the device of FIG. 1 may be fabricated.

DETAILED DESCRIPTION

In various embodiments, an apparatus and method relating to the formation of a substrate are described. In the following description, various embodiments will be described. However, one skilled in the relevant art will recognize that the various embodiments may be practiced without one or more of the specific details, or with other methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation.

Figure 1:
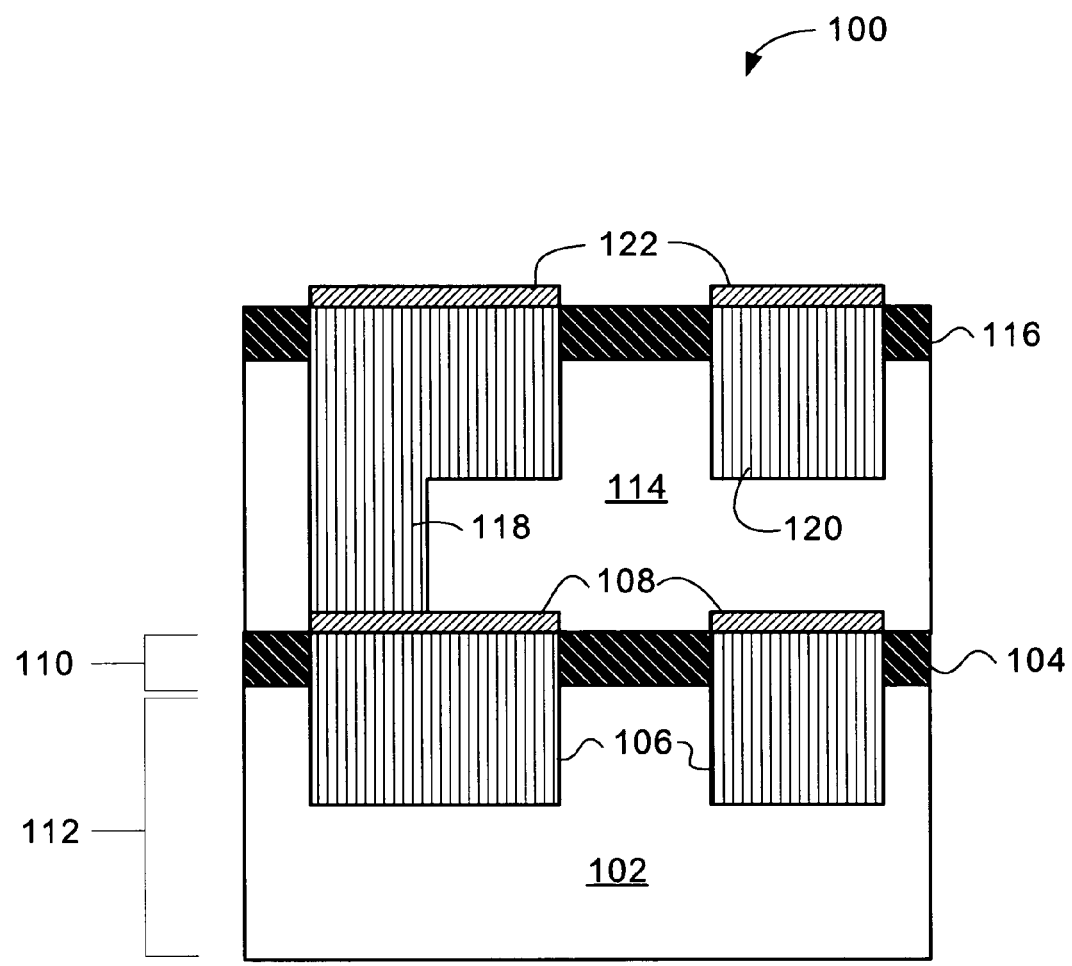
FIG. 1 is a side cross sectional view of a device with a low dielectric constant ("k value") hard mask layer.

FIG. 1 is a side cross sectional view of a device 100 with a low dielectric constant ("k value") hard mask layer, according to one embodiment of the invention. The device 100 may include a first interlayer dielectric ("ILD") layer 102. The first ILD layer 102 may comprise a low k value dielectric material. In an embodiment, the k value of the first ILD layer 102 may be below 3.2. In another embodiment, the k value may be below 3.0. In another embodiment, the k value may be between about 3.0 and about 2.4. In yet other embodiments, the k value may be different. The dielectric material of the first ILD layer 102 may comprise a carbon doped oxide ("CDO"), silicon dioxide (either undoped or doped with phophorus or boron and phosphorus, or another dopant), silicon nitride, silicon oxy-nitride, porous oxide, an organic containing silicon oxide, a polymer, or another material.

There may be a first hard mask layer 104 on the first ILD layer 102. The first hard mask layer 104 may comprise a low k value dielectric material. In some embodiments, the k value of the first hard mask layer 104 may be approximately the same as the k value of the first ILD layer 102, while in other embodiments the k value of the two layers 102, 104 may be different. For example, in an embodiment, the k value of the first hard mask layer 104 may be within about 1.0 of the k value of the first ILD layer 102. In an embodiment, the k value of the first hard mask layer 104 may be within about 0.5 of the k value of the first ILD layer 102, although other differences between the k values of the two layers 102, 104 may also exist in other embodiments. In an embodiment, the k value of the first hard mask layer 104 may be below 3.2. In another embodiment, the k value may be below 3.0. In another embodiment, the k value may be between about 3.0 and about 2.4. In yet other embodiments, the k value may be different. In some embodiments, the material of the first hard mask layer 104 may be compositionally or structurally different from the material of the first ILD layer 102 to allow high etch selectivity between the two layers 102, 104. For example, in some embodiments, the etch rate of the ILD layer 102 may be 25% to 50% faster than that of the first hard mask layer 104, though in other embodiments the etch selectivity of the various materials used for the layers 102, 104 and for various etching processes may be different. In some embodiments, the material of the first hard mask layer 104 may comprise below about 20% silicon. In some embodiments, the material of the first hard mask layer 104 may comprise between about 10% and about 20% silicon. In some embodiments, the material of the first hard mask layer 104 may comprise about 16% silicon, about 77% carbon, and about 7% oxygen.

The first ILD layer 102 may have a thickness 112 and the first hard mask layer 104 may have a thickness 110. In an embodiment, the first hard mask layer 104 may have a thickness 110 between about 100 angstroms and about 1000 angstroms. In another embodiment, the first hard mask layer 104 may have a thickness 110 between about 200 angstroms and about 1000 angstroms. In yet other embodiments, the thickness 110 of the first hard mask layer 104 may be greater than 1000 angstroms. In some embodiments, the thickness 110 of the first hard mask layer 104 may be as great as the thickness 112 of the first ILD layer 102. For example in some embodiments where the k value of the first ILD layer 102 and the k value of the first hard mask layer 104 are similar, having a large thickness 110 of the first hard mask layer 104 relative to the thickness 112 of the first ILD layer 102 may not substantially increase the k value of the combined layers 102, 104 to create RC delay problems. In other embodiments, the first hard mask layer 104 may have a thickness 110 that is greater or less than the thickness 112 of the first ILD layer 102.

The device 100 may include conductors, such as traces 106 in the first ILD layer 102 and/or first hard mask layer 104. The traces 106 may comprise a conductive material such as copper, aluminum, or another material. The traces 106 may extend at least partially into the first ILD layer 102 so that the first ILD layer 102 may partially surround the trace 106, as illustrated in FIG. 1. The bottom surface of the trace 106 may be below the top surface of the first ILD layer 102. The trace 106 may also have a top surface that extends above the top surface of the first ILD layer 102. In an embodiment illustrated in FIG. 1, the trace 106 may extend through the first hard mask layer 104 to result in the top surface of the trace 106 being substantially flush with the top surface of the first hard mask layer 104. In other embodiments, the trace 106 may be arranged differently and may not extend all the way through the first hard mask layer 104, or not extend into the hard mask layer 104 at all.

In some embodiments, there may be a cap layer 108 on the top surface of the trace 106. The cap layer 108 may be a thin conductive layer that may act as a barrier layer to prevent diffusion or electromigration of the material of the trace 106. In an embodiment, the cap layer 108 may comprise cobalt, although it may comprise other materials in other embodiments.

There may be a second ILD layer 114 on the first hard mask layer 104, trace 106, and/or cap layer 108. The second ILD layer 114 may comprise a low k material such as described above with respect to the first ILD layer 102. There may be a second hard mask layer 116 on the second ILD layer 114. The second hard mask layer 116 may comprise a low k material such as that described above with respect to the first hard mask layer 104. The thickness of the second hard mask layer 116 may also be as described above with respect to the first hard mask layer 104.

The device 100 may include additional conductors, such as trace 120 and via 118, in the second ILD layer 114 and/or second hard mask layer 116. Traces 120 in the second ILD layer 114 may be similar to the traces 106 in the first ILD layer 102 described above.

Vias 118 may extend all the way through the second ILD layer 114 to make an electrical connection with traces 106 or other conductors below. As with the traces 106, 120, vias 118 may comprise a conductive material such as copper, aluminum, or another material. The via 118 may extend into the second ILD layer 114 so that the second ILD layer 114 may partially surround the via 118, as illustrated in FIG. 1. The via 118 may have a top surface that extends above the top surface of the second ILD layer 114. In an embodiment illustrated in FIG. 1, the via 118 may extend through the second hard mask layer 116 to result in the top surface of the via 118 being substantially flush with the top surface of the second hard mask layer 116. In other embodiments, the via 118 may be arranged differently and may not extend all the way through the second hard mask layer 116, or not extend into the second hard mask layer 116 at all. Vias similar to the via 118 may also extend through the first ILD layer 102 and/or first hard mask layer 104.

There may be a cap layer 122 on the conductors 118, 120 of the second ILD layer 114. The cap layer 122 may be similar to the cap layer 108 described above.

FIGS. 2a through 2l are cross sectional side views that illustrate how the device 100 of FIG. 1 may be fabricated according to one embodiment of the present invention.

Figure 2A:
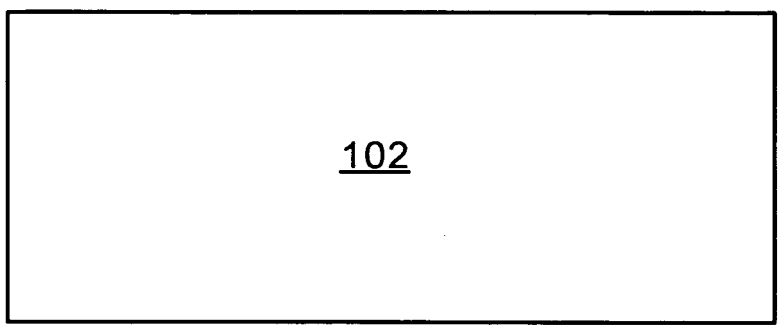

FIG. 2a illustrates the first ILD layer 102. The first ILD layer 102 may be a low k value material, as discussed above. In some embodiments, the first ILD layer 102 may be formed on a substrate (not shown). The substrate may include one or more layers and devices. The substrate may include conducting material, insulating material, semiconducting material, and other materials or material combinations. For example, in one embodiment the device 100 may be a microprocessor die and the substrate may include many millions of transistors.

Figure 2B:
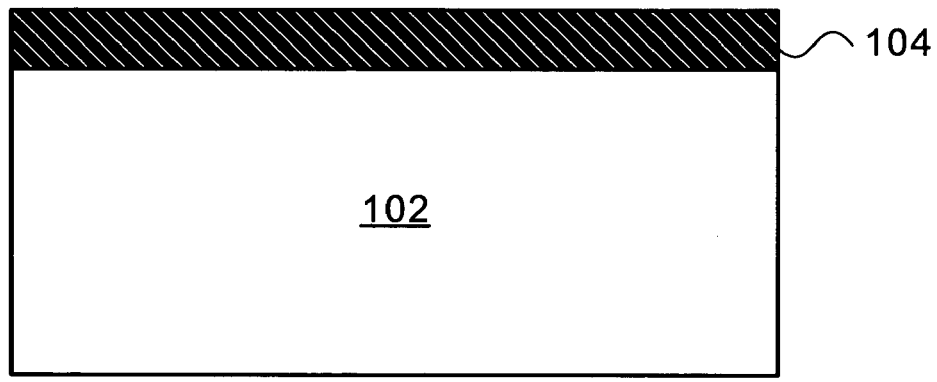

FIG. 2b illustrates the first hard mask layer 104 deposited on the first ILD layer 102. The first hard mask layer 104 may be a material as described above, with a thickness also as described above.

Figure 2C:
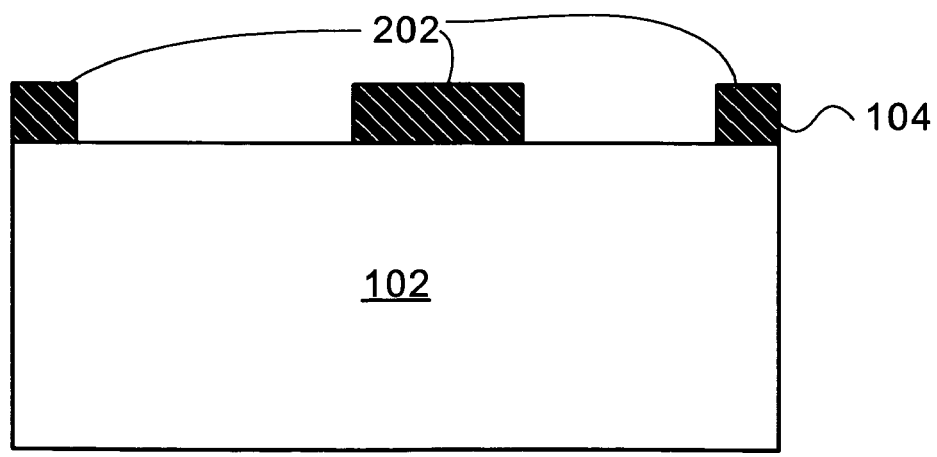

FIG. 2c illustrates the first hard mask layer 104 after it has been patterned, to form a patterned first hard mask layer 202. The patterning may be achieved by photolithography methods, including depositing a layer of photoresist, patterning the photoresist, then removing portions of the first hard mask layer 104 no longer covered by the photoresist. In some embodiments, an etching process, such as a chemical etch process or sputter etch process may be used to remove portions of the first hard mask layer 104 to form the patterned first hard mask layer 202. In some embodiments, because the first hard mask layer 104 covers and protects the first ILD layer 102 during photoresist development and removal processes, such processes may have little to no effect on the first ILD layer 102. Thus, in such embodiments, various different photoresist materials and photoresist patterning processes may be used without requiring matching of the material of the first ILD layer 102 to be compatible with the photoresist and photoresist processing steps. Also, in some embodiments use of the first hard mask layer 104 on the first ILD layer 104 may allow use of a thinner layer of photoresist to pattern what will eventually be holes and/or trenches in the first ILD layer 102. The use of a thinner photoresist layer may allow formation of finer features in the first ILD layer 102.

Figure 2D:
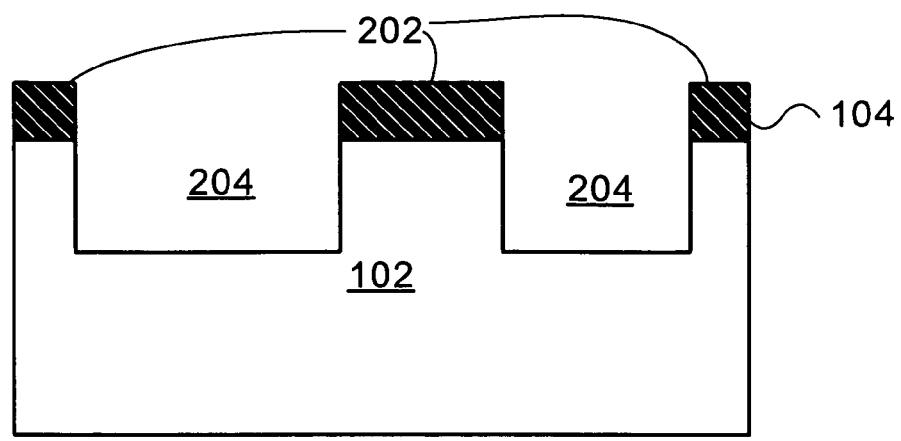

FIG. 2d illustrates trenches 204 formed in the first ILD layer 102. In an embodiment, the patterned hard mask layer 202 acts as a mask to remove selected portions of the first ILD layer 102 to form the trenches 204. In some embodiments, the photoresist layer may remain in place on the first hard mask layer 104 during formation of the trenches 204, while in other embodiments, the photoresist layer may be removed prior to formation of the trenches 204. In an embodiment, an etching operation may form the trenches 204 in the first ILD layer 102, although other processes to remove material from the first ILD layer 102 may be used to form the trenches 204. The illustrated trenches 204 extend only partially into the first ILD layer 102. In other embodiments, holes for vias may be formed that extend all the way through the first ILD layer 102 to any layers or devices below the first ILD layer 102.

Figure 2E:
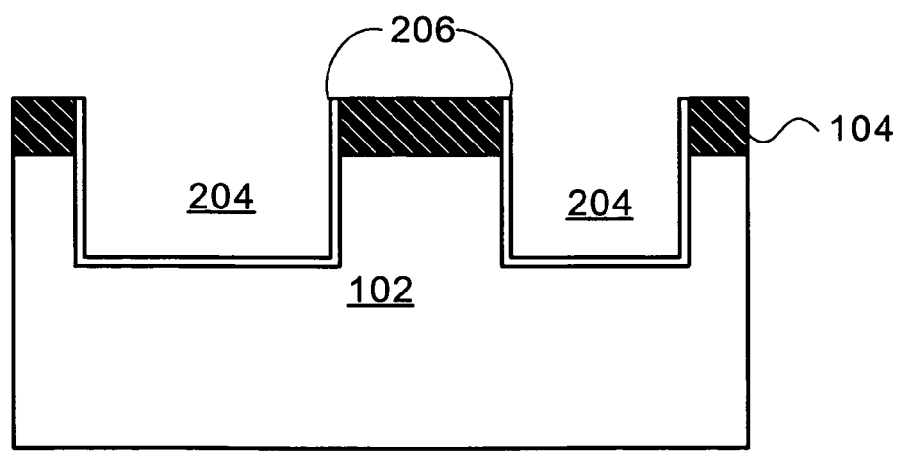

FIG. 2e illustrates a barrier layer 206 that may be deposited in the trenches 204. In some embodiments, a barrier layer 206 may be deposited in the trenches 204 to help prevent diffusion of additional material deposited in the trenches into the first ILD layer 102. In other embodiments, a seed layer may be deposited in the trenches 204 instead of the barrier layer 206 or in addition to the barrier layer 206. The seed layer may be a conductive layer that may allow, for example, electroplating of conductive material on the seed layer. In yet other embodiments, additional layers may be deposited in the trench 204 in addition to or in place of the barrier layer 206 and/or seed layer.

Figure 2F:
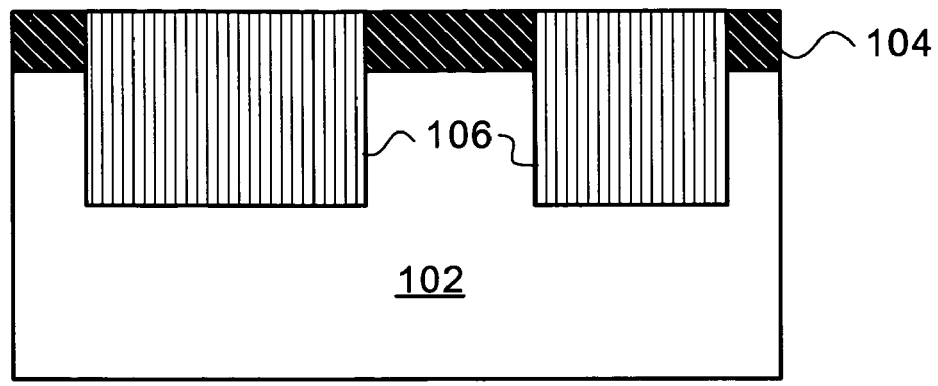

FIG. 2f illustrates the conductive traces 106 that have been formed in the trenches 204. As discussed above, the conductive traces 106 may comprise a conductive material, such as copper, aluminum, or another material, that may be deposited by electroplating or another method. In some embodiments where holes are formed all the way through the first ILD layer 102, one or more vias may be formed in addition to or in place of the traces. In the embodiment illustrated in FIG. 2f, the traces 106 extend partially into the first ILD layer 102, and are thus partially surrounded by the first ILD layer 102. The top surfaces of the traces 106 are above the top surface of the first ILD layer 102.

In some embodiments, after depositing the material to form the traces 106, a planarization process may be applied. This may be a chemical mechanical polishing ("CMP") process or another type of process, and may result in the top surface of the traces 106 being substantially flush with the top surface of the first hard mask layer 104.

Figure 2G:
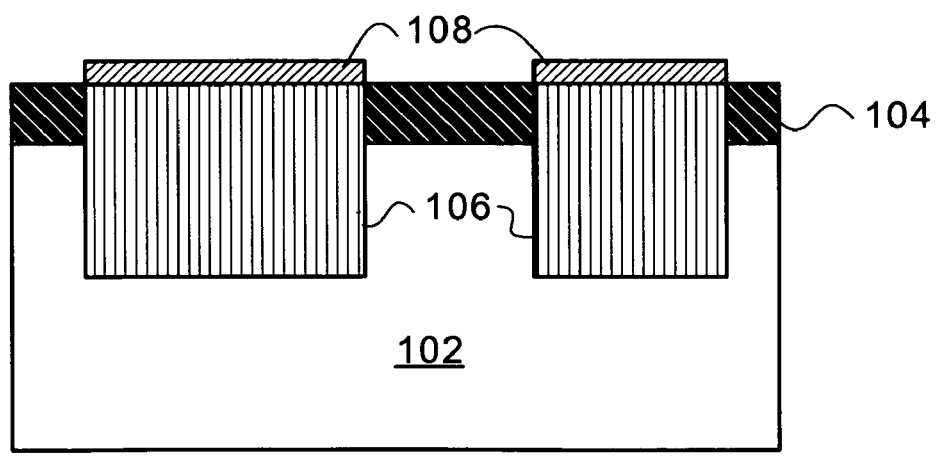

FIG. 2g illustrates a cap layer 108 that has been deposited on the traces 106. As described above, the cap layer 108 may be a thin conductive layer that may act as a barrier layer to prevent diffusion or electromigration of the material of the trace 106. In an embodiment, the cap layer 108 may comprise cobalt, although it may comprise other materials in other embodiments.

Figure 2H:
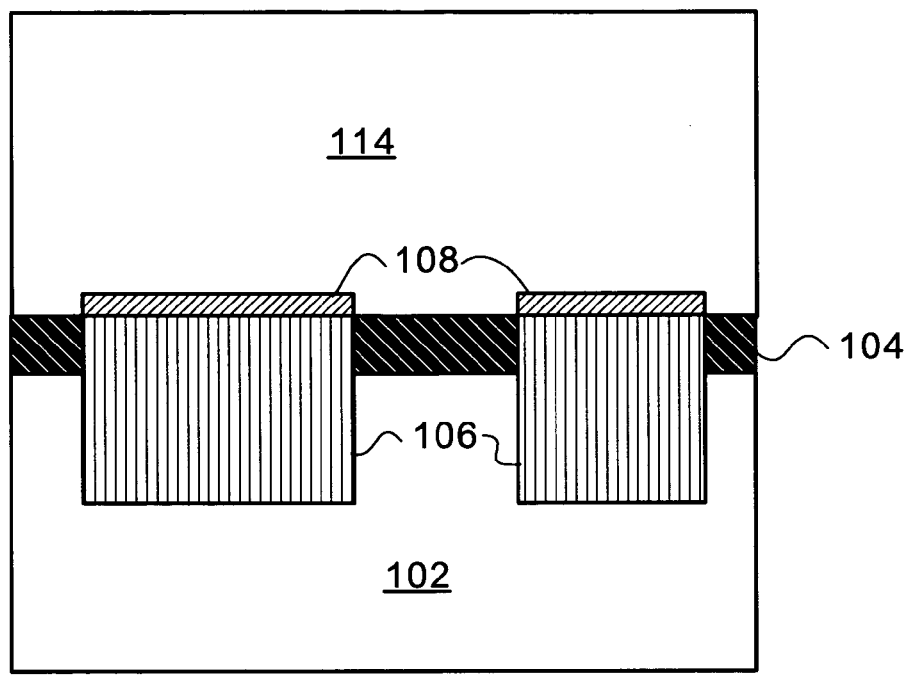

FIG. 2h illustrates the second ILD layer 114 formed on the first hard mask layer 104 and traces 106 in the first ILD layer 102. The second ILD layer 114 may be a material similar or identical to the material of the first ILD layer 102. As seen in FIG. 2h (as well as FIGS. 1 and 2i through 3d), the first hard mask layer 104 may remain in place on the first ILD layer 102 and below the second ILD layer 114 during the fabrication of the device 100 and in the completed device 100.

Figure 2I:
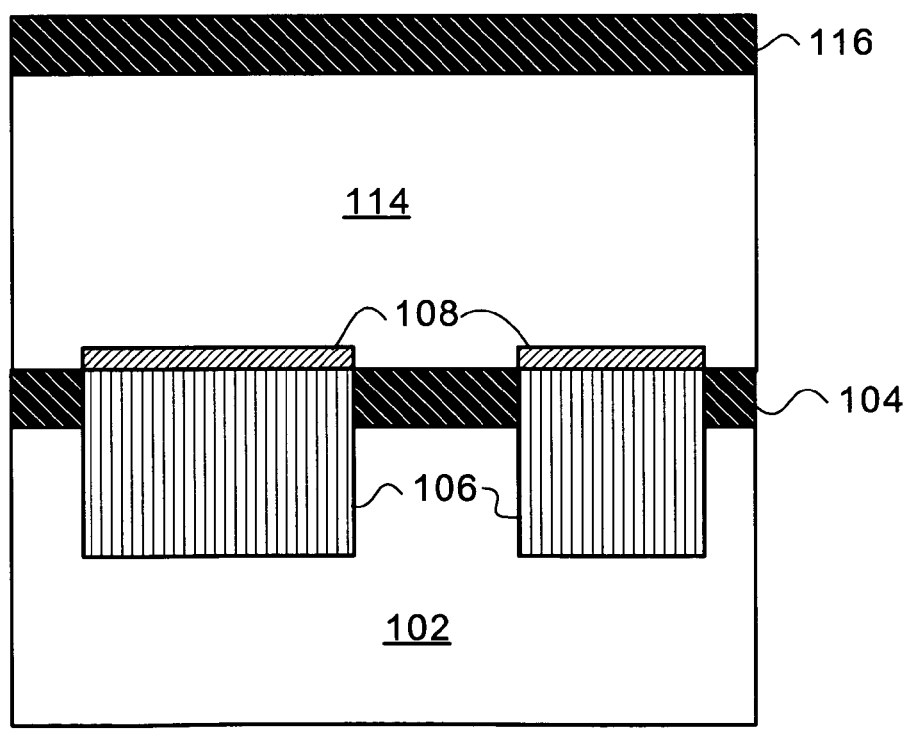

FIG. 2i illustrates the second hard mask layer 116 deposited on the second ILD layer 114. The second hard mask layer 116 may be a material similar or identical to the material of the first hard mask layer 104, as described above, with a thickness also similar or identical to that described above for the first hard mask layer 104 with respect to the first ILD layer 102.

Figure 2J:
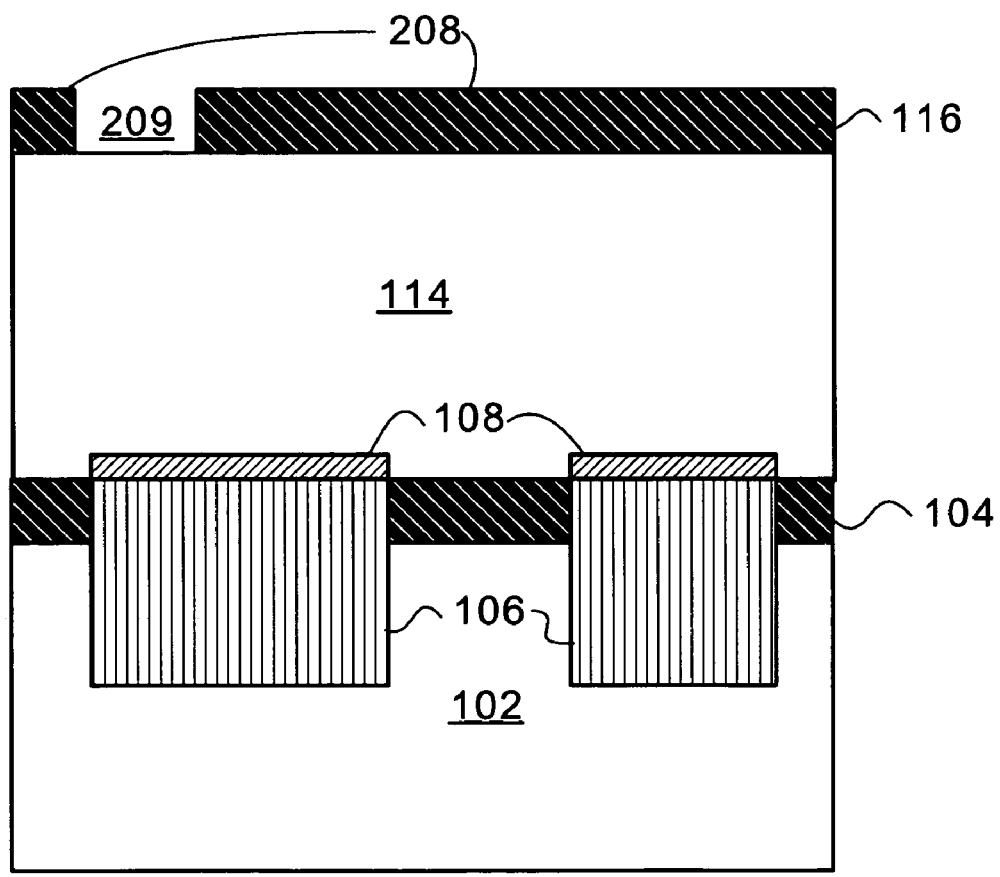

FIG. 2j illustrates the second hard mask layer 116 after it has been patterned, to form a patterned second hard mask layer 208, with a via opening 209 through which material of the second ILD layer 114 may be removed to form a via hole. This patterning may be performed in the same way as the patterning of the first hard mask layer 104, described with respect to FIG. 2c, above. In FIG. 2j, the patterned second hard mask layer 208 has been patterned to allow formation of a via hole through the second ILD layer 114.

Figure 2K:
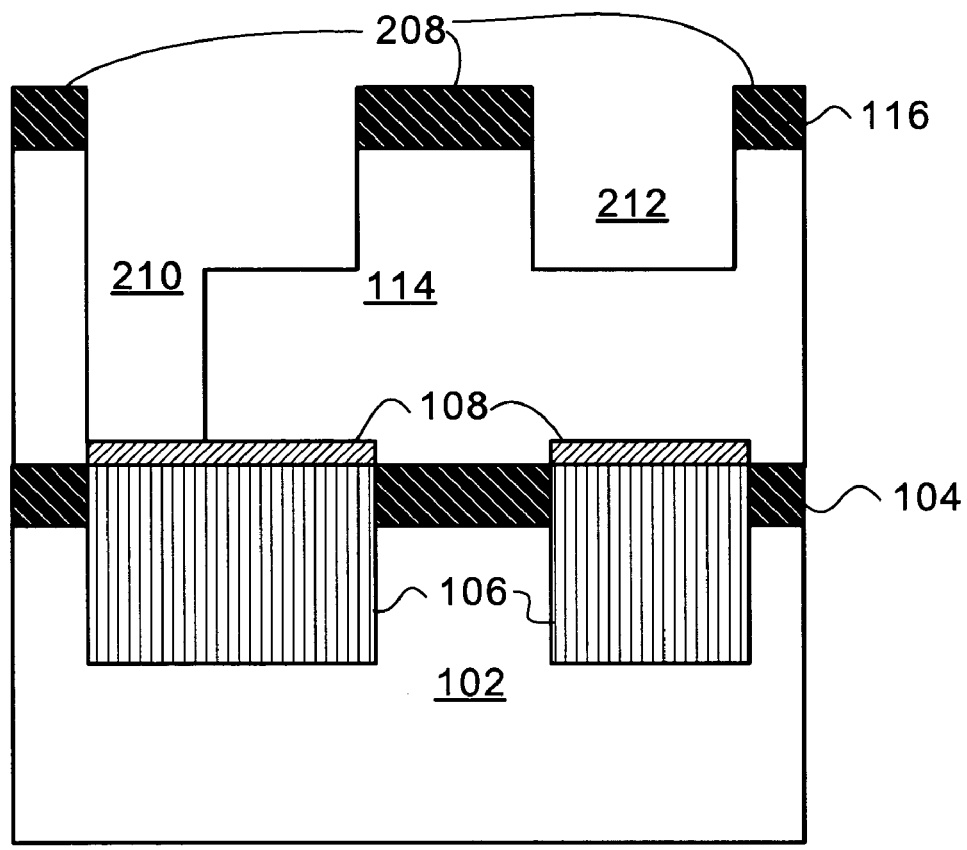
Figure 2I:
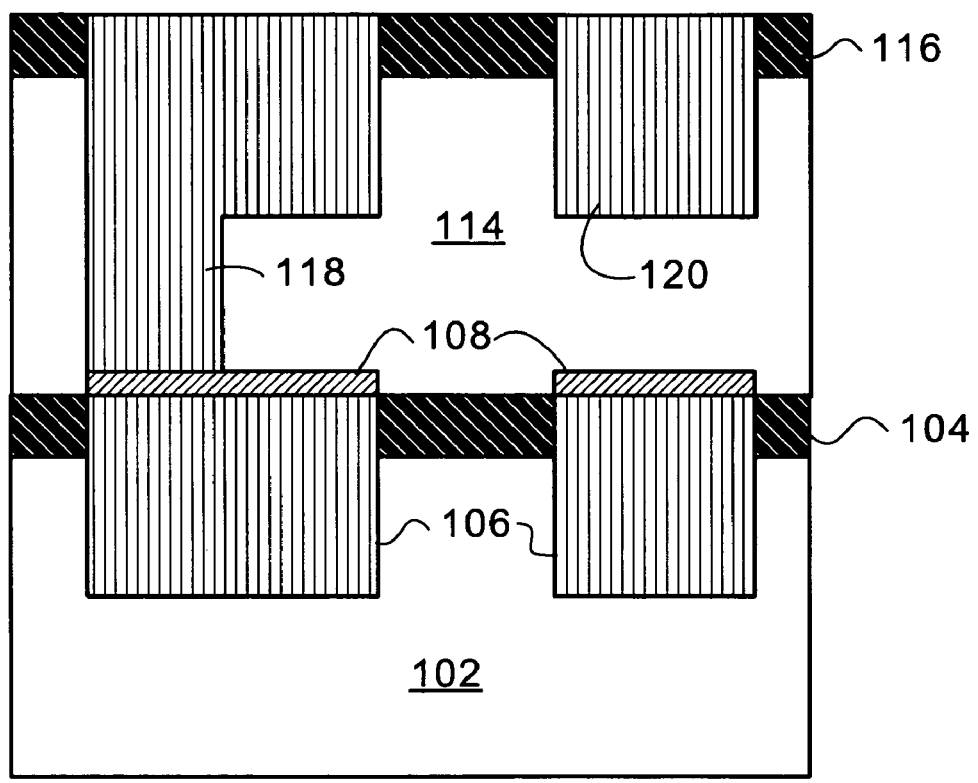

FIG. 2k illustrates a via hole 210 and a trench 212 formed in the second ILD layer 114. In an embodiment, the patterned hard mask layer 208 acts as a mask to allow removal of selected portions of the second ILD layer 114 to form the via hole 210. The first hard mask layer 104 may act as an etch stop layer to prevent removal of material of the first ILD layer 102 during formation of the via hole 210 if the via hole 210 is unlanded. The second hard mask layer 116 may then be patterned again to open holes in the second hard mask layer 116 to allow formation of trenches 212 in the second ILD layer 114. A barrier and/or other layer(s) (not shown) may be formed in the via hole 210 and/or trench 212.

FIG. 2l illustrates the conductive trace 120 and the via 118 that have been formed in the trench 212 and via hole 210. As discussed above, the trace 120 and the via 118 may comprise a conductive material, such as copper, aluminum, or another material, that may be deposited by electroplating or another method. In the embodiment illustrated in FIG. 2l, the trace 120 extends partially into the second ILD layer 114, and is thus partially surrounded by the second ILD layer 114. The top surface of the trace 120 is above the top surface of the second ILD layer 114. The via 118 extends all the way through the second ILD layer 114 to make electrical contact with the trace 106 in the first ILD layer 102. Vias 118 may also make electrical contact with vias in the first ILD layer 102, or other conductive structures.

In some embodiments, after depositing the material to form the trace 120 and via 118, a planarization process may be performed. This may be a chemical mechanical polishing ("CMP") process or another type of process, and may result in the top surface of the trace 120 and via 118 being substantially flush with the top surface of the second hard mask layer 116.

A cap layer 122 similar to the cap layer 108 may be deposited on the trace 120 and/or via 118. FIG. 1 illustrates an embodiment with such a cap layer.

FIGS. 3a through 3d are cross sectional side views that illustrate how fabrication of the device 100 of FIG. 1, with a hard mask that remains in place, may prevent formation of voids from unlanded via holes according to one embodiment of the present invention. An unlanded via hole is a via hole that is formed that extends laterally beyond the edge of the conductor at the bottom of the via hole. In such cases, portions of the material next to the conductor may be removed, leaving a high aspect ratio hole below the intended depth of the via hole and next to the conductor. When conductive material is deposited in the via hole, the high aspect ratio hole may be too deep and narrow to be filled with the conductive material, resulting in a void.

Figure 3A:
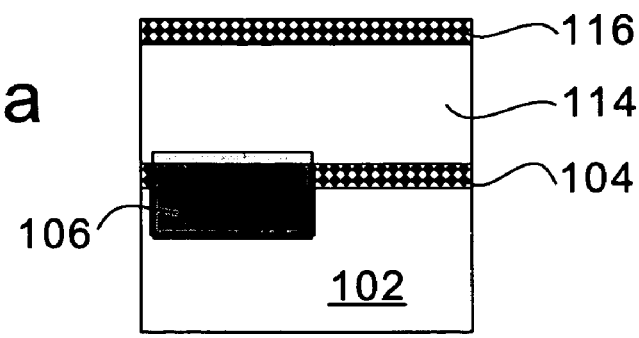
FIGS. 3a through 3d are cross sectional side views that illustrate the hard mask may prevent formation of voids from unlanded via holes.

FIG. 3a illustrates a trace 106 through the first hard mask layer 104 and extending partially into the first ILD layer 102. The second ILD layer 114 and second hard mask layer 116 have been formed on the trace 106 and first hard mask layer 104.

Figure 3B:
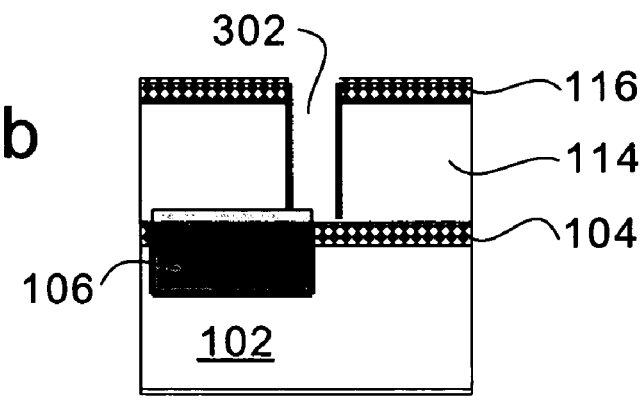

FIG. 3b illustrates an unlanded via hole 302 formed through the second hard mask layer 116 and second ILD layer 114. As can be seen in the Figure, the bottom of the via hole 302 has partially missed the trace 106. Since the first hard mask layer 104 has been left in place and the second ILD layer 114 formed on top of it, the first hard mask layer 104 may act as an etch stop layer, and prevent the portion of the via hole 302 that has missed the trace 106 from extending down below the surface of the first hard mask layer 104. This may substantially prevent formation of a high aspect ratio hole next to the trace 106, which may prevent formation of voids.

Figure 3C:
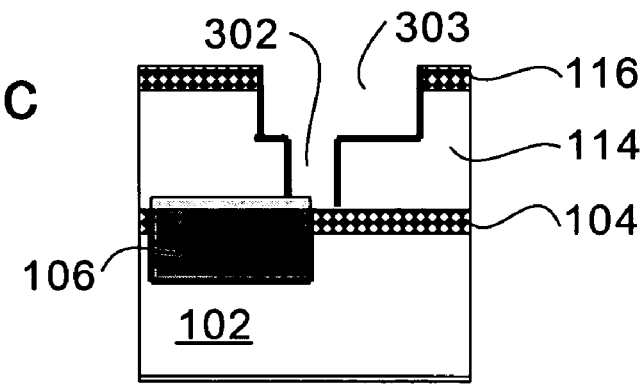
Figure 3D:
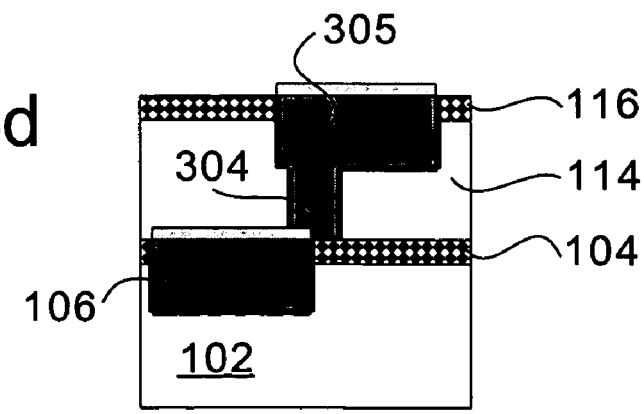

FIG. 3c illustrates formation of a trench 303 that extends part way into the second ILD layer 114. FIG. 3d illustrates formation of the via 304 and trace 305 in the unlanded via hole 302 and trench 303. Since the first hard mask layer 104 may prevent the formation of a high aspect ratio hole next to the trace 106, the first hard mask layer 104 may prevent formation of a void next to the trace 106 and below the via 302.

Similarly to the situation described in FIGS. 3a through 3d, a via hole 302 may be formed through a second hard mask layer 116 and second ILD layer 114 and not overlap with any portion of a trace 106 (where the via hole 302 of FIG. 3b only partially misses a trace 106). In such a situation, the hard mask layer 104 may act as an etch stop layer and substantially prevent the via hole 302 from extending down below the hard mask layer 104. This may prevent the aspect ratio of the via hole 302 from getting too large, and prevent formation of a void in such a large aspect ratio hole. This may allow unlanded vias to be formed without the formation of voids.

Figure 4:
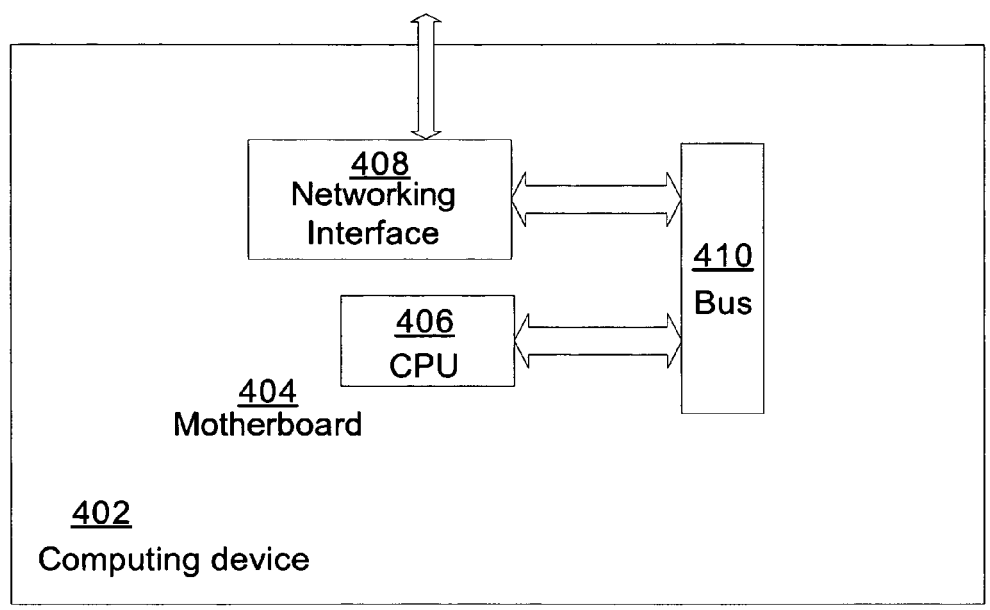
FIG. 4 illustrates a system in accordance with one embodiment.

FIG. 4 illustrates a system 400 in accordance with one embodiment. As illustrated, for the embodiment, system 400 includes computing device 402 for processing data. Computing device 402 may include a motherboard 404. Motherboard 404 may include in particular a processor 406, and a networking interface 408 coupled to a bus 410. More specifically, processor 406 may comprise the device 100 that has the earlier described low k hard mask layer.

Depending on the applications, system 400 may include other components, including but are not limited to volatile and non-volatile memory, a graphics processor, a digital signal processor, a crypto processor, a chipset, mass storage (such as hard disk, compact disk (CD), digital versatile disk (DVD) and so forth), and so forth. One or more of these components may also include the earlier described compliant interconnects.

In various embodiments, system 400 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

The foregoing description of the embodiments of the invention has been presented for the purposes of illustration and description. It is not intended to be exhaustive or to limit the invention to the precise forms disclosed. Various additional layers and/or structures may be included or omitted from the described embodiment. Processes described may performed in a different order than the described embodiment and steps may be left out/or added in additional embodiments. This description and the claims following include terms, such as left, right, top, bottom, over, under, upper, lower, first, second, etc. that are used for descriptive purposes only and are not to be construed as limiting. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

We claim:

1. A device, comprising:
   a first interlayer dielectric layer with a top surface and having a low dielectric constant;
   a first conductive trace extending at least partially into the first interlayer dielectric layer, and having a top surface above the top surface of the first interlayer dielectric layer;
   a first hard mask layer having a low dielectric constant with a top surface substantially flush with the top surface of the first conductive trace the first hard mask layer being substantially free of hydrogen and comprising between about 10% and about 20% silicon, wherein each of the first hard mask layer and the first interlayer dielectric layer has a dielectric constant value of less than about 3.2;
   a second interlayer dielectric layer on the first conductive trace and first hard mask layer, and having a top surface;
   a conductive cap layer on the first conductive trace, between the first conductive trace and the second interlayer dielectric layer;
   a second conductive trace extending at least partially into the second interlayer dielectric layer, and having a top surface above the top surface of the second interlayer dielectric layer; and
   a second hard mask layer with a top surface substantially flush with the top surface of the second conductive trace.

2. The device of claim 1, wherein the conductive cap layer on the first conductive trace, between the first conductive trace and the second interlayer dielectric layer, does not extend substantially beyond the first conductive trace onto the first hard mask layer.

3. The device of claim 1, wherein the first hard mask layer has a thickness between about 200 angstroms and about 1000 angstroms.

4. The device of claim 1, wherein the first interlayer dielectric layer has a dielectric constant value and the first hard mask layer has a dielectric constant value within about 0.5 of the dielectric constant value of the first interlayer dielectric layer.

5. The device of claim 1, wherein the dielectric constant value of each of the first interlayer dielectric layer and the first hard mask layer is in a range from about 2.4 to less than about 3.2.

6. The device of claim 1, wherein the first hard mask layer comprises about 16% silicon, about 77% carbon, and about 7% oxygen.

7. A device, comprising:
   a first interlayer dielectric layer with a top surface;
   a first hard mask layer on the first interlayer dielectric layer having a bottom surface adjacent the top surface of the first interlayer dielectric layer, the first hard mask layer being substantially free of hydrogen;
   a first conductive trace at least partially surrounded by the first interlayer dielectric layer; and
   wherein each of the first hard mask layer and the first interlayer dielectric layer has a dielectric constant value of less than about 3.2, wherein the first hard mask layer comprises between 10% and 20% silicon.

8. The device of claim 7, wherein the first hard mask layer comprises about 16% silicon, about 77% carbon, and about 7% oxygen.

9. The device of claim 7, wherein the first conductive trace has a top surface above the top surface of the first interlayer dielectric layer.

10. The device of claim 9, wherein the first hard mask layer has a top surface substantially flush with the top surface of the first conductive trace.

11. The device of claim 7, wherein the dielectric constant values of the first interlayer dielectric layer and the first hard mask layer are approximately equal.

12. The device of claim 7, wherein the first hard mask layer has a thickness between about 200 angstroms and about 1000 angstroms.

13. The device of claim 7, wherein the dielectric constant value of each of the first interlayer dielectric layer and the first hard mask layer is in a range from about 2.4 to less than about 3.2.

14. The device of claim 7, further comprising:
   a second interlayer dielectric layer on the first conductive trace and first hard mask layer, and having a top surface;

a second hard mask layer on the second interlayer dielectric layer having a bottom surface adjacent the top surface of the second interlayer dielectric layer;

a second conductive trace at least partially surrounded by the second interlayer dielectric layer; and wherein each of the second hard mask layer and the second interlayer dielectric layer has a dielectric constant value of less than about 3.2.

* * * * *